(12) United States Patent
Heinrich et al.

(10) Patent No.: US 11,004,823 B2
(45) Date of Patent: May 11, 2021

(54) CHIP ASSEMBLY AND METHOD OF MANUFACTURING THEREOF

(71) Applicant: Infineon Technologies AG, Neubiberg (DE)

(72) Inventors: Alexander Heinrich, Bad Abbach (DE); Frank Daeche, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/523,789

(22) Filed: Jul. 26, 2019

(65) Prior Publication Data

US 2020/0035645 A1 Jan. 30, 2020

(30) Foreign Application Priority Data

Jul. 27, 2018 (DE) .......................... 102018118251.1

(51) Int. Cl.
*H01L 21/48* (2006.01)
*H01L 23/00* (2006.01)
*H01L 23/13* (2006.01)

(52) U.S. Cl.
CPC .......... *H01L 24/97* (2013.01); *H01L 21/4825* (2013.01); *H01L 21/4853* (2013.01);
(Continued)

(58) Field of Classification Search
CPC . H01L 21/4825; H01L 21/4835; H01L 23/00; H01L 23/13; H01L 23/142; H01L 23/5389; H01L 24/19; H01L 24/20; H01L 24/29; H01L 24/35; H01L 24/73; H01L 24/83; H01L 24/84; H01L 24/92; H01L 24/95; H01L 24/97; H01L 21/48; H01L 21/4853; H01L 2924/15153; H01L 2224/18; H01L 2224/83192; H01L 2224/83203; H01L 2224/05124; H01L 2224/05172; H01L 2224/05647; H01L 2224/29155; H01L 2224/29164; H01L 2224/05644; H01L 2224/05155; H01L 2224/29109; H01L 2224/29111; H01L 2224/29144; H01L 2224/2912;
(Continued)

(56) References Cited

U.S. PATENT DOCUMENTS 6,838,776 B2 * 1/2005 Leal .................... H01L 23/5389
257/783
2005/0064201 A1 * 3/2005 Noro ...................... H01L 23/293
428/414

(Continued)

FOREIGN PATENT DOCUMENTS

DE 10325559 B3 12/2004
DE 102008011153 A1 5/2009
(Continued)

*Primary Examiner* — Chuong A Luu
(74) *Attorney, Agent, or Firm* — Murphy, Bilak & Homilier, PLLC

(57) ABSTRACT

A chip assembly includes a carrier and a metal grid array having an opening. The metal grid array is attached to the carrier by an attachment material. The metal grid array and the carrier define a cavity which is formed by the opening and the carrier. The chip assembly further includes an electronic chip mounted in the cavity.

18 Claims, 4 Drawing Sheets

(52) U.S. Cl.
CPC .............. *H01L 23/13* (2013.01); *H01L 24/83* (2013.01); *H01L 2224/83192* (2013.01); *H01L 2224/83203* (2013.01)

(58) Field of Classification Search
CPC . H01L 2224/29194; H01L 2224/05639; H01L 2224/05166; H01L 2224/29116; H01L 2224/29147; H01L 2224/29139; H01L 2224/73267; H01L 2224/92244; H01L 2224/32245
USPC .................................. 257/677; 438/106, 126
See application file for complete search history.

(56) References Cited

U.S. PATENT DOCUMENTS

| | | | |
|---|---|---|---|
| 2008/0313894 A1 | 12/2008 | Fillion et al. | |
| 2008/0318054 A1 | 12/2008 | Fillion et al. | |
| 2011/0059582 A1 | 3/2011 | Liu | |
| 2016/0111390 A1* | 4/2016 | Ziglioli | H01L 24/94 257/415 |
| 2017/0040183 A1* | 2/2017 | Sakai | H01L 23/4952 |
| 2018/0226555 A1* | 8/2018 | Ng | H01L 23/49811 |
| 2018/0366418 A1* | 12/2018 | Hua | H01L 29/45 |
| 2020/0075828 A1* | 3/2020 | Ghosal | H01L 35/16 |

FOREIGN PATENT DOCUMENTS

| | | |
|---|---|---|
| DE | 102011056700 A1 | 6/2013 |
| DE | 102014114982 A1 | 4/2016 |

\* cited by examiner

CHIP ASSEMBLY AND METHOD OF MANUFACTURING THEREOF

TECHNICAL FIELD

The herein disclosed subject matter relates to a chip and a chip assembly and a method of manufacturing the same.

BACKGROUND

For processing and/or use, individual electronic chips may typically be placed and fixed on a common carrier, for example on a lead frame a printed circuit board. (PCB) or a direct copper bonding (DCB) substrate. To this end, the electronic chips may be placed and fixed on to the carrier one by one. Alternatively, the chips may be placed top-down on an intermediate carrier, then together placed on the carrier and commonly fixed, e.g. by a hot die attach process.

Further, DE 10 2014 114 982 A1 discloses a method of forming a chip assembly which includes forming a plurality of cavities in a carrier, arranging a die attach liquid in each of the cavities, arranging a plurality of chips on the die attach liquid, evaporating the die attach liquid and, after evaporating the die attach liquid, fixing the plurality of chips to the carrier.

SUMMARY

There may be a need to improve a manufacture of a chip assembly and in particular a chip base.

According to a first aspect of the herein disclosed subject matter, a method of manufacturing a chip assembly is provided. According to an exemplary embodiment, the method of manufacturing a chip assembly comprises: providing a carrier; providing a metal grid array, the metal grid array comprising at least one opening; attaching the metal grid array to the carrier by an attachment material wherein the metal grid array and the carrier define at least one cavity each of which is formed by one of the at least one opening and the carrier; mounting an electronic chip in each of the at least one cavity. According to a further exemplary embodiment, the method of manufacturing a chip assembly comprises: providing a carrier; providing an attachment material on the carrier; providing a metal grid array, the metal grid array comprising at least one opening; attaching the metal grid array to the carrier by the attachment material wherein the metal grid array and the carrier define the at least one cavity each of which is formed by one of the at least one opening and the carrier; mounting an electronic chip in each of the at least one cavity.

According to a second aspect of the herein disclosed subject matter, a chip assembly is provided. According to an exemplary embodiment, the chip assembly comprises: a carrier; a metal grid array comprising at least one opening; the metal grid array being attached to the carrier by an attachment material; the metal grid array and the carrier defining at least one cavity each of which is formed by one of the at least one opening and the carrier (102); and an electronic chip being mounted in each of the at least one cavity. According to a further exemplary embodiment, the chip assembly comprises: a carrier; a metal grid array comprising at least one opening; the metal grid array being attached to the carrier by an attachment material; the metal grid array and the carrier defining at least one cavity each of which is formed by one of the at least one opening and the carrier; and an electronic chip being mounted in each of the at least one cavity.

In the following, further exemplary embodiments of the chip base, the chip assembly and the methods will be described.

In the context of the present application, the term "package" may particularly denote at least one at least partially encapsulated electronic chip with at least one external electric contact. The package may be for example a surface mounted device (SMD) or a through hole mounted device (TMD).

The term "the packaging" may particularly denote at least partially encapsulating an electronic chip with an encapsulant.

The term "electronic chip" may particularly denote a semiconductor chip having at least one integrated circuit element (such as a diode or a transistor) in a surface portion thereof. The electronic chip may be a naked die or may be already packaged. According to an embodiment, the electronic chip comprises (e.g. is) a semiconductor chip, in particular a power semiconductor chip, e.g. a vertical current device, in particular an insulated gate bipolar transistor (IGBT), a metal oxide field effect transistor (MOSFET), a silicon carbide (SiC) device or a gallium nitride (GaN) device. According to an embodiment, a power semiconductor chip is a chip with vertical power flow (i.e. a vertical current device, in particular a chip with a load electrode (e.g. a single load electrode) on each of opposing sides of the chip. According to an embodiment, a power semiconductor chip comprises at least one of an insulated gate bipolar transistor, a field effect transistor, (such as a metal oxide semiconductor field effect transistor), a diode, etc. With such constituents, it is possible to provide packages for automotive applications, high-frequency applications, etc. Examples for electric circuits which can be constituted by such and other power semiconductor circuits and packages are half-bridges, full bridges, etc.

In the context of the present application, the term "encapsulant" may particularly denote a substantially electrically insulating and preferably thermally conductive material surrounding (for example hermetically surrounding) an electronic chip and part of a carrier, to provide mechanical protection, electrical insulation, and optionally a contribution to heat removal during operation. In an embodiment, the encapsulant may be a molding material. Hence, the package may comprise a package body formed at least partially from a mold ng material. For instance, a package may be provided by placing an electronic chip, in particular with carrier and optional further components) into a mold and inject liquid mold material therein. After solidification of the mold material, formation of the encapsulant is completed. If desired, the mold material may be filled with particles improving its properties. In an embodiment, the encapsulant comprises a laminate, in particular a printed circuit board laminate. According to an embodiment, the method further comprising arranging a laminate over the electronic chip.

In the context of the present application, the term "laminate" or "laminate structure" may particularly denote an integral flat member formed by electrically conductive structures and/or electrically insulating structures which may be connected to one another by applying a pressing force. The connection by pressing may be optionally accompanied by the supply of thermal energy. Lamination may hence be denoted as the technique of manufacturing a composite material in multiple layers. A laminate can be permanently assembled by heat and/or pressure and/or welding and/or adhesives. According to another embodiment, the encapsulant comprises a laminate comprising at least one electrically insulating layer and at least one electrically conductive layer.

In an embodiment, the laminate is a printed circuit board (FOB) laminate. Thus, the material of the laminate may be in particular on the basis of resin (in particular epoxy resin), if desired mixed with particles (such as fibers, for instance glass fibers). Suitable dielectric, materials for the laminate are prepreg or FRA. A suitable electrically conductive material for the laminate is copper.

In an embodiment, the electronic chip comprises an electrically conductive contact structure on a main surface being in contact with the laminate. For instance, the electronic chip may be arranged with a first surface (e.g. its active surface or top surface) facing towards the exterior laminate layer or layers (i.e. face up). Alternatively, for instance when electronic chips with a vertical current flow, power semiconductor chips, etc. are implemented, it is also possible that both sides of the electronic chips have electric contacts. In such a case the electronic chip may be arranged with a second surface (e.g. its bottom surface) facing towards the exterior laminate layer or layers (i.e. face up).

In an embodiment, the method further comprises forming, in particular drilling, more particularly laser drilling, at least one through hole extending through the laminate to thereby expose a surface of the electronic chip. Laser drilling through the laminate material to expose one or more pads of the electronic chip is a simple and reliable procedure for quickly and precisely defining electric contacts. Hence, in such a case the through hole may also be referred to as contact hole.

In an embodiment, the method further comprises filling the at least one through hole with electrically conductive material, in particular by plating. For example, copper material may be filled in the through-holes formed by laser drilling, mechanical drilling or the like.

In the context of the present application, the term. "substrate" may particularly denote an at least partially electrically conductive structure which serves as a support for the one or more chips, and/or which contributes to the electric interconnection between the chip(s) and at least one further component (e.g. an internal component and/or an external component). In other words, the carrier may fulfil a mechanical support function and/or an electric connection function.

In the context of the present application, the term. "component" may particularly denote any electric or electronic member which can be electrically connected to a carrier to provide its electronic function to the package. In particular, the component may be a passive component such as a conductive trace, an inductor (in particular a coil), a capacitor (such as a ceramic capacitor), an ohmic resistance, an inductance, a diode, a transformer, etc. In particular components being not capable of controlling current by another electrical signal may be denoted as passive components. However, the component may also be an active component, in particular may be a component being capable of controlling current by another electrical signal. Active components may be an analog electronic filter with the ability to amplify a signal or produce a power gain, an oscillator, a transistor or another integrated circuit element.

In an embodiment, the carrier is a metallic carrier, in particular a leadframe. In the context of the present application, the term "leadframe" may particularly denote a preferred example of a carrier being configured as a sheet-like metallic structure which can be patterned (e.g. stamped or etched) so as to form leadframe sections for mounting the chip(s). Electric connection of the chip(s) to the carrier may be established by solder (e.g. solder pads), wires, etc. In an embodiment, the leadframe may be a metal plate (i.e. a thin metal plate which may also be referred to as metal foil), in particular made of copper, nickel, silver, steel, or other suitable materials, in particular suitable metals) which may be patterned, for instance by stamping or etching. Forming the carrier as a leadframe is a cost-efficient and mechanically as well as electrically highly advantageous configuration in which a low ohmic connection of the chip(s) and the component(s) can be combined with a robust support capability of the leadframe. Furthermore, a leadframe may contribute to the thermal conductivity of the package and may remove heat generated during operation of the chip(s) and the component(s) as a result of the high thermal conductivity of the metallic (in particular cooper) material of the leadframe. A leadframe or any other metallic carrier may be preferred due to its simplicity.

According to another embodiment, the carrier is a printed circuit board (PCB). Thus, the carrier may be in particular manufactured on the basis of resin (in particular epoxy resin), if desired mixed with particles (such as fibers, for instance glass fibers). Suitable dielectric materials for the PCB are e.g. prepreg or FR4. A suitable electrically conductive material for the PCB is copper.

According to an embodiment, the carrier is a layered structure comprising a ceramic part and a metal part. For example, according to an embodiment the carrier is a direct copper bonding (DCB) substrate comprising a ceramic plate and copper layers bonded to one side thereof (or two opposing sides thereof). Bonding between the copper layer and the ceramic plate may be provided by a copper-oxygen eutectic which forms bonds between the copper layer and the ceramic plate. The copper-oxygen eutectic may be formed by heating the copper layer and the ceramic plate to controlled temperature in an atmosphere of nitrogen containing an amount of 20-40 ppm of oxygen. The copper layer bonded to the ceramic may be shaped into a pattern (e.g. the copper layer may be preformed (e.g. stamped) before the bonding to the ceramic plate or may be structured (e.g. by etching). According to an embodiment, the formation of the copper layer on the ceramic plate comprises applying a seed layer and plating the seed layer. The ceramic material may comprise for example one or more of alumina (Al2O3), aluminum nitride (AlN) or beryllium oxide (BeO), the copper layers may have a thickness in a range between 200 micrometer ($\mu$m) and 300 $\mu$m and may be plated, e.g. with nickel, a nickel alloy, aluminum nickel or aluminum.

In an embodiment, the at least one electronic chip comprises at least one of the group consisting of a controller circuit, a driver circuit, and a power semiconductor circuit. All these circuits may be integrated into one electronic chip, or separately in different chips. For instance, a corresponding power semiconductor application may be realized by the chip(s), wherein integrated circuit elements of such a power semiconductor chip may comprise at least one transistor, such as at least one insulated gate bipolar transistor (IGBT) and/or at least one field effect transistor and/or at least one silicon carbide (SiC) device and/or at least one gallium nitride (GaN) device, (in particular a MOSFET, metal oxide semiconductor field effect transistor), at least one diode, etc. In particular, circuits fulfilling a half-bridge function, a full-bridge function, etc., may be manufactured. According to an embodiment, the (at least one) electronic chip has a metallization on at least one outer surface (e.g. a backside metallization). According to an embodiment, the metallization comprises at least one of aluminum (Al), titanium (Ti), nickel (Ni), vanadium (V), silver (Ag) and copper (Cu), or at least one alloy of one or more of these metals. According to an embodiment, the metallization is an Al/TiNiV/Ag (4LBSM) layer stack. According to a further embodiment, the metallization is an Ti/NiV/Ag layer stack. According to a further embodiment, the metallization is an Al/Ti/Cu layer stack.

A typical die thickness is in a range of 60 µm to 200 µm, e.g. in a range of 60 µm to 110 µm. According to a further embodiment, the thickness is even smaller, e.g. larger than 20 µm. According to a further embodiment, the thickness is between 200 µm and 210 µm, e.g. is equal to or smaller than 205 µm.

According to an embodiment, the metal grid array comprises a plurality of openings and the carrier and the metal grid array attached to the carrier—manufactured as an intermediate device—define a plurality of cavities. In accordance with an embodiment, each cavity of the plurality of cavities is formed by one of the plurality of openings and the carrier.

According to an embodiment, the metal grid array and the carrier are commonly referred to as chip base to which a plurality of electronic chips is mounted in the plurality of cavities.

Providing the cavities by a carrier and an attached metal grid array with openings facilitates providing a cavity with a tin plated planar bottom. A planar bottom improves the reliability of a connection of the respective electronic chip to the bottom of the cavity. Further, providing a cavity by providing a opening in the metal grid array facilitates providing the cavity with the dimensional accuracy.

According to an embodiment, the method of manufacturing a chip assembly further comprises providing an attachment material on the carrier. According to a further embodiment, the method of manufacturing a chip assembly further comprises providing an attachment material on the metal grid array. The attachment material can be provided by wet chemical methods. In particular, the attachment material can be provided by electroless plating, galvanic electroplating. Further, the attachment material can be provided by physical vapor deposition or as a thin preform, just to name some examples. According to an embodiment, the attachment material layer has a thickness in a range of 1 µm to 50 µm, e.g. in a range of 1 µm-20 µm. According to an embodiment, the method comprises providing the attachment material on the carrier as a homogeneous layer. According to a further embodiment the layer of attachment material is homogeneous in at least one of composition, thickness.

According to a further embodiment, attaching the metal grid array to the carrier comprises attaching the metal grid array to the carrier by the attachment material. In other words, the attachment material may serve for the attachment of the carrier and the metal grid array to each other.

According to a further embodiment, the attachment material on the carrier is distributed such that a bottom of each cavity comprises the attachment material. For example, in such an embodiment the attachment material may serve for attaching the at least one electronic chip to its associated cavity. According to an embodiment, for each cavity an associated electronic chip is provided. For example, in an embodiment a single electronic chip is placed in each cavity.

In accordance with an embodiment, the metal grid array comprises a layer of the attachment material and providing a metal grid array comprises providing the metal grid array having the layer of attachment material thereon.

According to a further embodiment, mounting an electronic chip in each of the at least one cavity comprises mounting an electronic chip having a further attachment material thereon in each of the at least one cavity.

Hence, if the attachment material is provided on the metal grid array, the electronic chip may comprise a further attachment material for mounting (attaching) the electronic chip in the respective cavity to the carrier. The further attachment material may be of the same type as the attachment material described herein. In particular any embodiment referring to an attachment material under or below the electronic chip may be considered as to include a further embodiment wherein the "attachment material" under or below the electronic chip is the further attachment material. According to an embodiment, properties of the further attachment material may be identical to one or more properties specified for the attachment material (e.g. material type, layer thickness, etc.).

According to an embodiment, the metal grid array and the electronic chip may have an approximately equal thickness. If the attachment material is provided below the metal grid array and below the electronic chip, the pressure on the attachment material exerted by the metal grid array and the electronic chip may be equal or at least similar if an external pressure is exerted by a planar pressure exerting surface. Further, in this case also the deformation of the attachment material under the metal grid array and under the electronic chip may be equal or at least similar. According to a further embodiment, the pressure exerted on the chip is smaller than a pressure exerted on the metal grid array. This may be accomplished by a resilient pressing tool portion over the chip and a less resilient pressing tool portion over the metal grid array. In other words, in an embodiment, the resiliency of the pressing tool over the chip is lower than the resiliency of the pressing tool over the metal grid array. According to a further embodiment, the pressure exerted on the chip is smaller than a pressure exerted on the metal grid array because a thickness of the chip is smaller than the thickness of the metal grid array. A typical die thickness is in a range of 60 µm to 200 µm, e.g. in a range of 60 µm to 110 µm. According to a further embodiment, the thickness is even smaller, e.g. larger than 20 µm. According to a further embodiment, the thickness is between 200 µm and 210 µm, e.g. is equal to or smaller than 205 µm. In particular, attaching the electronic chip and/or the metal grid array on the carrier may be carried out on batch level. Subsequently, the structure composed of multiple arrangements of chip, carrier and metal grid array, the lateral surrounding structure (metal grid array and carrier) on batch level may be singularized, for instance by mechanical cutting (e.g. sawing), etching or laser cutting. This allows for a particular efficient manufacture of multiple packages with high throughput. According to an embodiment the method comprises singulating the plurality of cavities after mounting the electronic chips in the plurality of cavities. According to an embodiment, each electronic chip is one of a plurality of electronic chips.

According to an embodiment, the attachment material is provided as a attachment material layer on the carrier. In particular, the attachment material layer has an essentially constant thickness over the area of the carrier. For example, according to an embodiment the thickness variation of the attachment material layer is less than 10% (or less than 5%) of an average thickness of the attachment material layer.

According to an embodiment, each electronic chip comprises a mounting surface. In accordance with an embodiment, the mounting surface of the electronic chip is made of metal. For example, according to an embodiment the mounting surface of the electronic chip is provided by a rear side metallization (also referred to as backside metallization) of the electronic chip. According to an embodiment, the mounting surface comprises gold. According to a further embodiment, the mounting surface is provided by a metallization layer stack comprising at least one, e.g. at least two or even at least three layers. According to an embodiment, the metallization comprises at least one of aluminum (Al), titanium (Ti), nickel (Ni), vanadium (V), silver (Ag) and copper (Cu), or at least one alloy of one or more of these metals. According to an embodiment, the metallization is a Al/TiNiV/Ag (4LBSM) layer stack. According to a further embodiment, the metallization is a Ti/NiV/Ag layer stack. According to a further embodiment, the metallization is an. Al/Ti/Cu layer stack. According to a further embodiment, the attachment material comprises a metal, e.g. a solderable metal. According to a further embodiment, the attachment material is a solder (e.g. a soft solder or a diffusion solder) or a sintering material. According to a further embodiment, the attachment material comprises at least one of tin (Sn), a tin alloy, antimony (Sb), an antimony alloy, silver (Ag), a silver alloy, gold (Au), and a gold alloy, e.g. gold-tin alloy or a gold-silver alloy. In particular a sintering material may comprise silver (Ag), copper (Cu) and/or tin (Sn) or alloys thereof. According to an embodiment, the attachment material comprises silver, copper, tin, antimony and/or indium and/or alloys thereof as a sinter material or at least one of a lead-tin solder, nickel-gold solder, tin-silver solder, tin-indium-solder, tin-silver-copper solder (SAC=Sn—Ag—Cu solder), palladium-gold solder, nickel-palladium-gold-silver solder as a solder material, in particular a diffusion solder material. According to an embodiment sintering materials (as attachment material) may be provided at a thickness of 150 μm.

According to an embodiment, in the method of manufacturing a chip assembly the mounting of the electronic chip comprises providing a die attachment liquid or a die attachment film in the at least one cavity and placing the electronic chip into the die attachment liquid or onto the die attachment film. According to an embodiment, a die attach liquid is provided. In the cavity before placing the electronic chip in the cavity. According to an embodiment, the die attach liquid is a volatile, non-reactive liquid, e.g. methanol, ethanol, isopropanol or a mixture thereof, with or without further additives. According to an embodiment, the die attach liquid is a fluorocarbon-based fluid. According to a further embodiment, the die attach liquid is for example FC-43 or FC-70 (commercially available products). According to an embodiment, the die attach liquid (or the die attach film) is removed from the cavity before attaching the die to the cavity. For example, removing the die attach liquid may include evaporating the die attach liquid or burning the die attach liquid. For example, in an embodiment the die attach liquid surface is provided for holding the electronic chip in the cavity until the electronic chic is attached to the chip base (e.g. until chip assembly with the chip base and the electronic chip subjected to heat and/or pressure e.g. of a hot die attach process). However, placing the electronic chip in the cavity and attaching the electronic chip to the chip base may also be performed without the die attach liquid (generally without any intermediate attachment material which is removed before the attachment of the electronic chip to the chip base).

According to an embodiment, mounting the electronic chip to the chip base in the associated cavity comprises pressing the electronic chip (being located in the associated cavity) and the carrier towards each other at an high temperature (e.g. at a temperature above room temperature, such as a temperature sufficient to form thermodynamically stable intermetallic phase, e.g. a temperature sufficient to form a diffusion solder interconnect, e.g. a copper-tin-copper (Cu—Sn—Cu) interconnect or a gold-tin-copper (Au—Sn—Cu) interconnect, e.g. a temperature in a range between 200° C. and 400° C.

According to an embodiment, mounting the electronic chip to the chip base in the associated cavity comprises pressing the electronic chip (being located in the associated cavity) and the carrier towards each other at an high temperature (e.g. at a temperature sufficient to form a soft solder interconnect or a sintering interconnect.

According to an embodiment, the mounting of the electronic chip to the chip base comprises pressing both, the electronic chip and the metal grid array (on the one hand), and the carrier (on the other hand) towards each other at the high temperature. According to an embodiment, subjecting the electronic chip and the chip base to heat and/or pressure includes subjecting the electronic chip and the chip base to heat and/or pressure so as to form a first diffusion solder interconnect between the electronic chic and the carrier and a second diffusion solder interconnect between the metal grid array and the carrier. Hence, according to an embodiment the attachment of the electronic chip to the carrier and the attachment of the metal grid array to the carrier is performed in a common processing step which may include subjecting the chip assembly to heat and/or pressure.

According to an embodiment, the metal grid array s a stamped metal sheet. In other words, according to an embodiment, the at least one opening of the metal grid array is formed by stamping. However, other methods for providing the openings are also contemplated, e.g. cutting, such as laser cutting, etc.

According to an embodiment, the carrier comprises a metal. According to an embodiment, the metal grid array is made from a sheet metal. A sheet metal or metal sheet may also be referred to as a metal foil.

According to a further embodiment, at least one of the carrier and the metal grid array comprises copper or a copper alloy. According to a further embodiment, at least one of the carrier and the metal grid array comprises copper (or a copper alloy) with a coating layer. According to an embodiment, the coating layer comprises nickel or nickel phosphor. According to a further embodiment, the carrier comprises a metal layer on its surface on which the attachment material is provided. According to an embodiment, the carrier is a lead frame. According to a further embodiment, the carrier is a printed circuit board (PCB). According to a further embodiment, the carrier is a direct copper bonding (DCB) substrate as described above.

According to an embodiment, in a direction perpendicular to a front surface of the metal grid array a front surface of the mounted electronic chip in the cavity is spaced from the front surface of the metal grid array by 10% or less (or, in another embodiment by 5% or less, or even by 1% or less) of the thickness of the metal grid array, wherein the front surface of the metal grid array faces away from the carrier and the front surface of the mounted electronic chip faces away from the carrier. According to an embodiment, the thickness of the metal grid array is in a range of 20 μm to 250 μm, e.g. in a range between 20 μm to 110 μm. According to a further embodiment, the thickness of the metal grid array is in a range of 60 μm to 110 μm, and is, e.g., 100 μm. For example, for a thickness of the metal grid array of 100 micrometer (μm), the front surface of the mounted electronic chip is, in a direction perpendicular to the front surface of the metal grid array, spaced from front surface of the metal grid array by 10 μm or less.

Such essentially level front surfaces of the metal grid array and the mounted electronic chip have the advantage that the laminate comprising at electrically insulating layer and at least one electrically conductive layer is more easily arranged over the front surfaces of the metal grid array and the mounted electronic chip. Further, generating of contact holes in the laminate to the surface of electronic chip and to the surface of the metal grid array does not require an adjustment of a focus position of a hole generating laser beam in beam direction.

According to an embodiment at least one of the carrier and the metal grid array comprises at least one alignment element for alignment and/or fixation of the carrier and the metal grid array with respect to each other. Accordingly, in an embodiment, the method comprising aligning the carrier and the metal grid array with respect to each other. According to a further embodiment, the at least one alignment element incudes at least one of an alignment pin, a protrusion, a groove, a hole, etc. The at least one alignment element may include mating alignment elements, e.g. an alignment pin in one of the carrier and the metal grid array and a pin receiving recess in the other of the carrier and the metal grid array.

In the above there have been described and in the following there will be described exemplary embodiments of the subject matter disclosed herein with reference to a chip assembly and a method of manufacturing the same. It has to be pointed out that of course any combination of features relating to different aspects of the herein disclosed subject matter is also possible. In particular, some features have been or will be described with reference to device type embodiments whereas other features have been or will be described with reference to method type embodiments. However, it should be understood from the above and the following description that, unless otherwise notified, in addition to any combination of features belonging to one aspect also any combination of features relating to different aspects or embodiments, for example even combinations of features of device type embodiments and features of the method type embodiments are considered to be disclosed with this application. In this regard, it should be understood that any method feature derivable from a corresponding explicitly disclosed device feature should be based on the respective function of the device feature and should not be considered as being limited to device specific elements disclosed in conjunction with the device feature. Further, it should be understood that any device feature derivable from a corresponding explicitly disclosed method feature can be realized based on the respective function described in the method with any suitable device feature disclosed herein or known in the art.

The above and other objects, features and advantages of the herein disclosed subject matter will become apparent from the following description and the appended claims, taken in conjunction with the accompanying drawings, in which like parts or elements are denoted by like reference numbers.

BRIEF DESCRIPTION OF THE FIGURES

The accompanying drawings are included to provide a further understanding of exemplary embodiments of the herein disclosed subject matter and constitute a part of the specification. In particular, the accompanying drawings illustrate exemplary combinations of embodiments of the herein disclosed subject matter.

In the drawings.

DETAILED DESCRIPTION

Figure 1:
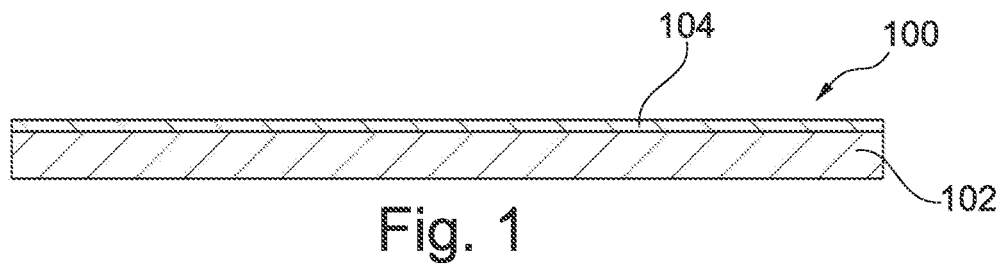
FIG. 1 to FIG. 6 illustrate respective cross-sectional views of structures obtained during manufacturing of a chip assembly shown in FIG. 6, according to embodiments of the herein disclosed subject matter.

The illustration in the drawing is schematic and not necessarily drawn to scale.

Before exemplary embodiments will be described in more detail referring to the Figures, some general considerations will be summarized based on which exemplary embodiments have been developed.

Figure 4:
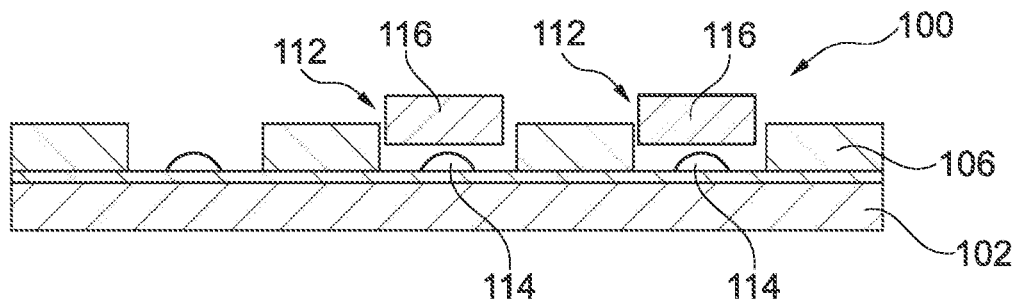
Figure 5:
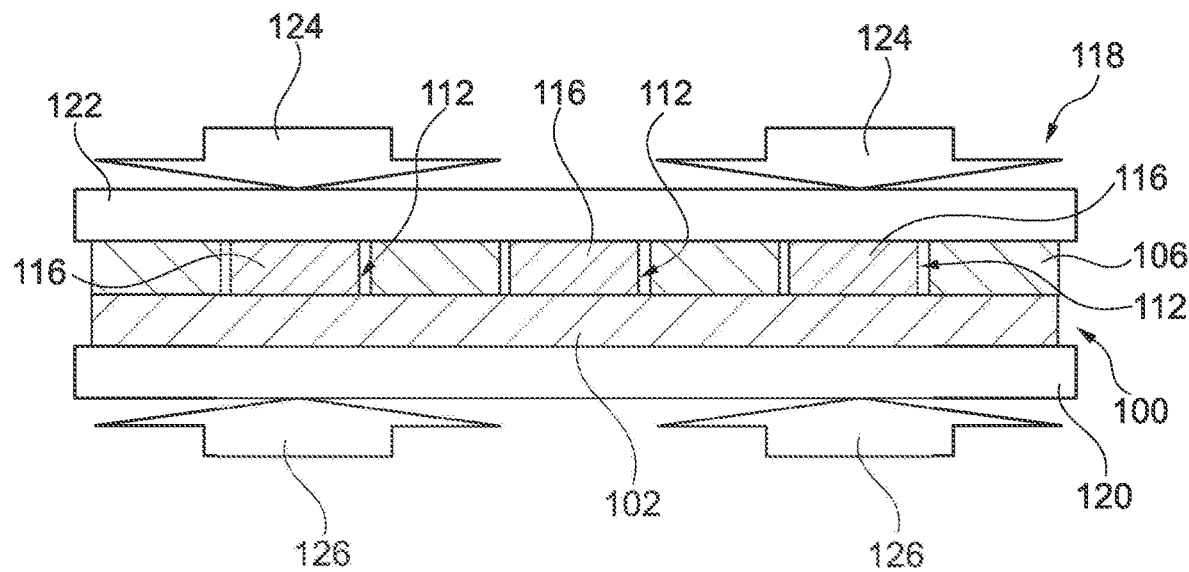
Figure 6:
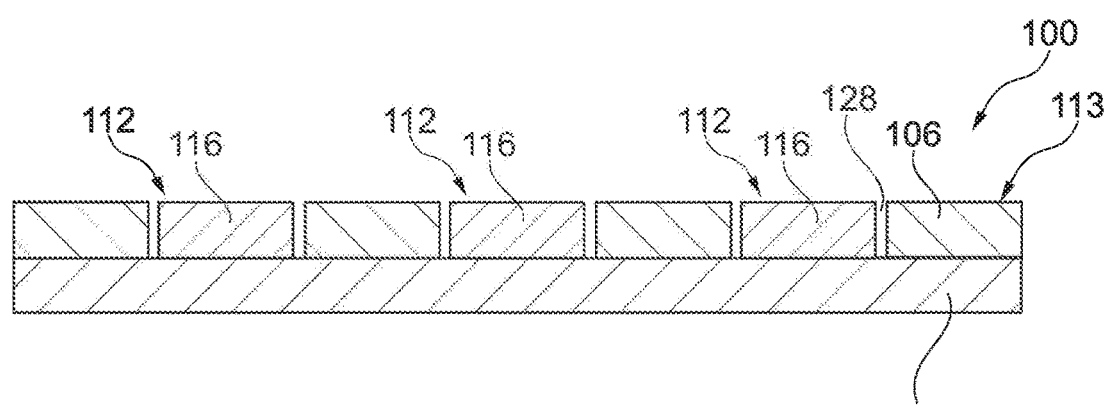

FIG. 1 to FIG. 6 illustrate cross-sectional views of structures obtained during manufacturing of a chap assembly shown in FIG. 6, according to embodiments of the herein disclosed subject matter.

FIG. 1 illustrates a part of a chip assembly 100 according to embodiments of the herein disclosed subject matter.

In accordance with an embodiment, a carrier 102 of chip assembly 100 is provided and a layer of an attachment material 104, e.g. a tin layer, a layer of tin alloy, silver, silver alloy, gold, or gold alloy, e.g. a layer of a gold-tin alloy or a gold-silver alloy, is provided on the carrier 102. In accordance with an embodiment, the carrier 102 is a lead frame, e.g. a copper lead frame which according to an embodiment may be coated (or partially coated) with a coating material such as nickel or nickel phosphor. In other embodiments, the substrate 102 is a DCB substrate or a PCB. In accordance with an embodiment, the layer of attachment material 104 is provided on the carrier 102 by plating.

Figure 2:
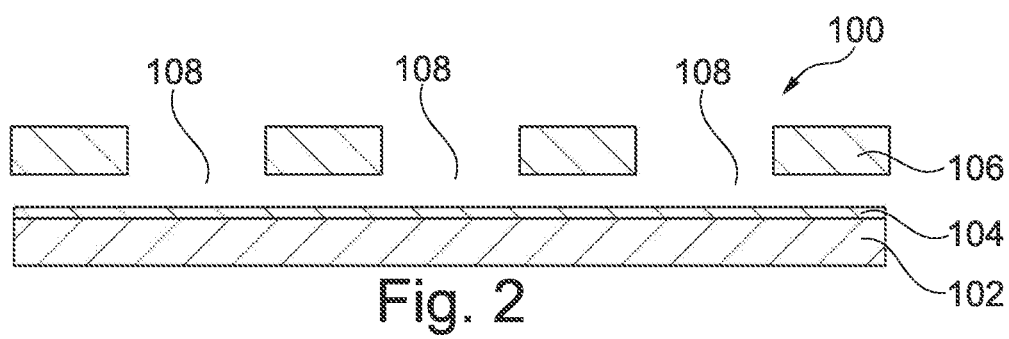

FIG. 2 shows the chip assembly 100 in a further manufacturing stage according to embodiments of the herein disclosed subject matter.

In accordance with an embodiment, a metal grid array 106 is provided over the carrier 102. According to an embodiment, the metal grid array 106 is provided on the layer of attachment material 104. According to an embodiment, the attachment material 104 is provided on the carrier 102 as a homogeneous layer. The attachment material can be applied by any suitable process e.g. a wet chemical method, electroplating, electroless plating, physical vapor deposition, chemical vapor deposition, etc.

Alternatively (not shown in FIG. 2), the attachment material 104 may also be provided on the metal grid array 106. However, this has the disadvantage that a further attachment material may be needed on the carrier in the region of the opening of the metal grid array. In accordance with an embodiment, the metal grid array 106 is a metal foil and comprises a plurality of openings 108. In accordance with an embodiment, the metal grid array 106 is a stamped copper foil.

Figure 3:
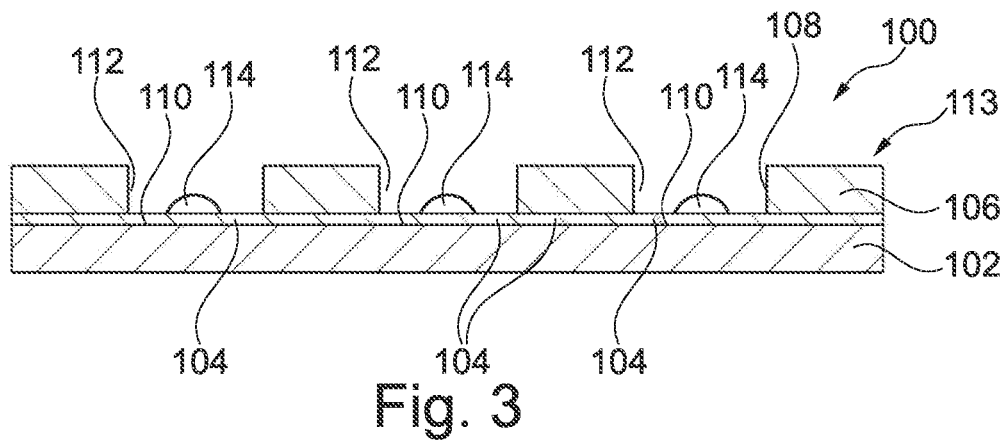

FIG. 3 shows the chip assembly 100 in a further manufacturing stage according to embodiments of the herein disclosed subject matter.

In accordance with an embodiment, the metal grid array 106 is attached to the carrier 102 by the attachment material 104. Further, the attachment material 104 is also provided on a bottom 110 of a cavity 112 which is defined by the carrier 102 and the metal grid array 106. In accordance with an embodiment, the bottom. 110 is formed by the carrier 102. According to an embodiment, the carrier 102 and the metal grid array 106 are part of a chip base 113.

Further in accordance with an embodiment, a die attach liquid 114 is provided on the attachment material 104 on the bottom 110 of the cavity 112.

FIG. 4 shows the chip assembly 100 in a further manufacturing state according to embodiments of the herein disclosed subject matter.

In accordance with an embodiment, a plurality of electronic chips 116, two of which are shown in FIG. 4, are placed on the die attach liquid 114 in the associated cavity 112.

FIG. 5 shows the chip assembly 100 in a further manufacturing stage according to embodiments of the herein disclosed subject matter.

In accordance with an embodiment, an electronic chip 116 part of a plurality of electronic chips has been placed in each of the cavities 112 which are defined by the carrier 102 and the metal grid array 106.

In accordance with an embodiment, the chip assembly 100 is placed in a press tool 118 between a first press part 120 and a second press part 122. According to an embodiment, a force indicated by arrows 124 is imposed on the chip assembly 100, the force having a value of at least 1 newton per square millimeter ($N/mm^2$). According to an embodiment, the force is in a range between 1 $N/mm^2$ and 100 $N/mm^2$, e.g. in a range between 1 $N/mm^2$ and 20 $N/mm^2$. In accordance with a further embodiment, the chip assembly 100 is subjected to a high temperature, i.e. heat, indicated by arrows 126 in FIG. 5, e.g. in a reflow oven, the temperature of which exceeds the melting temperature of the applied attachment material 104. According to an embodiment the attachment of the (at least one) chip and the metal grid array on the carrier results in a positive substance jointing (German: stoffschlüssige Verbindung).

According to an embodiment, by heating, 126, the chip assembly to a first temperature the die attach liquid 114 is evaporated from the cavity 112, in particular is evaporated without any residuals in the cavity. In further embodiments, no die attach liquid or the like is used. In other words, in an embodiment, the chip is placed directly on the attachment material (without any further material in-between).

According to an embodiment, the attachment material is provided also in a lateral space between the metal grid array and the chip. For example, according to an embodiment, by exerting pressure on the chip and hence on the attachment material, a part of the attachment material is pressed into the space between the metal grid array and the chip. A homogeneous thickness of the attachment material and/or a homogeneous pressure on the chip may be seen from an equal distribution of attachment material on a surface of the metal grid array and/or the chip (e.g. from an equal distribution of attachment material in the vicinity of the corners of the opening.

Further, in accordance with an embodiment the temperature of the chip assembly 100 is raised to a second temperature suitable to attach the chips 116 to the carrier 102 and/or the metal grid array 106 by the attachment material 104. For example, if the if the attachment material 104 is a sinter material, comprising e.g. at least one of silver (Ag), tin (Sn), and copper (Cu), the second temperature is chosen such that sintering process takes place and is completed within a desired time period. If for example the attachment material 104 is a soft solder material, the second temperature is chosen such that the soft solder material liquifies. If for example the attachment material 104 is a diffusion solder material, the second temperature is chosen such that the diffusion solder material forms the desired intermetallic phase within a desired time period.

FIG. 6 shows the chip assembly 100 in a further manufacturing stage according to embodiments of the herein disclosed subject matter.

In particular, depending on the attachment material used, at least after cooling down the chip assembly 100 to room temperature the chip assembly 100 comprises the plurality of electronic chips 116 located in the cavities 112 defined by the first part 102 and the second part 106 and attached to the chip base 113.

Figure 7:
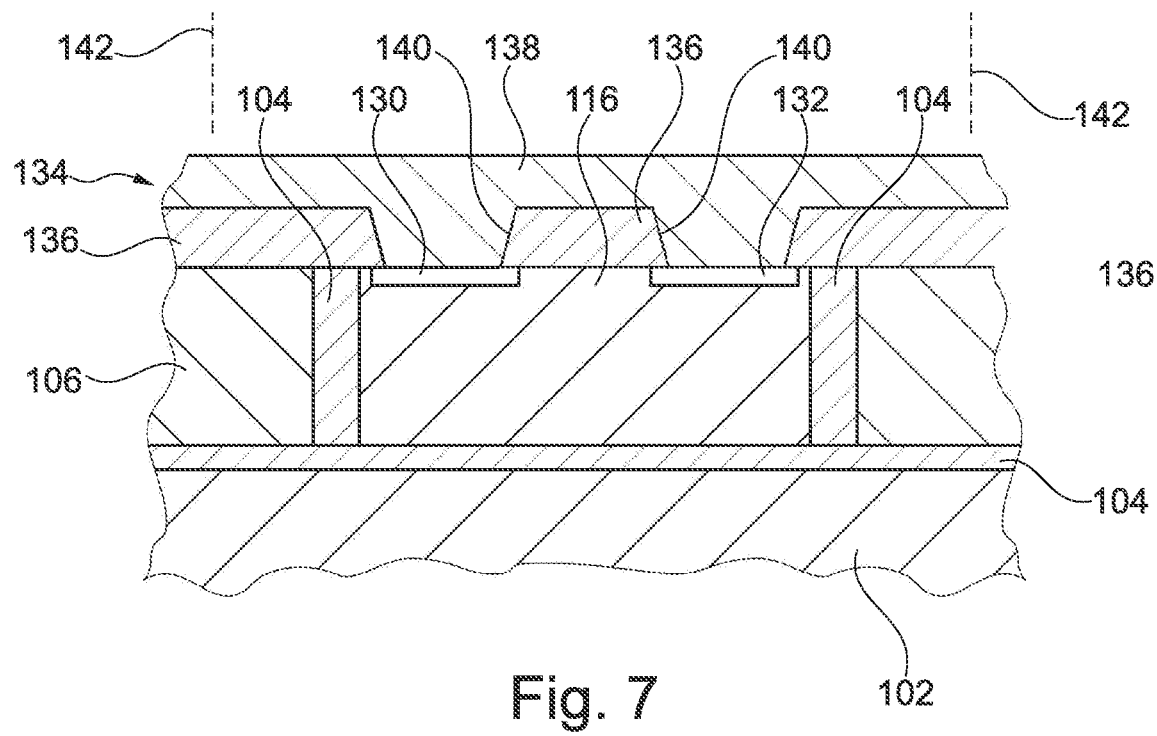
FIG. 7 illustrates a part of the chip assembly of FIG. 6 in greater detail.

FIG. 7 shows a part of the chip assembly 100 of FIG. 6 in greater detail.

According to an embodiment, the electronic chip 116 is a power semiconductor device which comprises a first load electrode 130 and a second load electrode 132. For example, according to an embodiment the power semiconductor device is a diode. According to the another embodiment, the power semiconductor devices a transistor which further comprises a gate electrode (not shown in FIG. 7) for controlling an electrical conductivity between the first and second load electrode 130, 132.

According to an embodiment, a laminate 134 is provided over the chip assembly 100 so as to form a package. The laminate 134 may comprise a stack of at least one electrically insulating layer 136 and at least one electrically conductive layer 138, e.g. as shown in FIG. 7. According to an embodiment, the laminate 134, e.g. an insulating layer thereof (e.g. the insulating layer 136) comprises a trough hole 140 extending to the load electrode 130, 132. By providing the electrically conductive layer 138 of the laminate (e.g. a copper layer), the through hole 140 is filled with the material of the conductive layer, thus establishing an electrical contact between the electrically conductive layer 138 and the load electrode 130, 132. According to an embodiment, the electrically conductive layer 138 is provided by plating. According to another embodiment, the laminate 134 is a preformed intermediate element which comprises the at least one electrically insulating layer 136 and at least one electrically conductive layer 138 when being applied to the electronic chip 116 and the chip base 113. In such a case, the filling of the through hole with conductive material is separate from the providing of the electrically conductive layer.

According to an embodiment, the attachment material 104 may extend into a lateral space 128 between the electronic chip 116 and the chip base 113. In other words, in an embodiment, the attachment material 104 extends into a space 128 between the electronic chip 116 and the metal grid array 106.

Further FIG. 7 indicates possible singulation lines along which the chip assembly 100 can be singulated. According to an embodiment, the singulation lines 142 extend through the metal grid array 106, e.g. as shown in FIG. 7.

Figure 8:
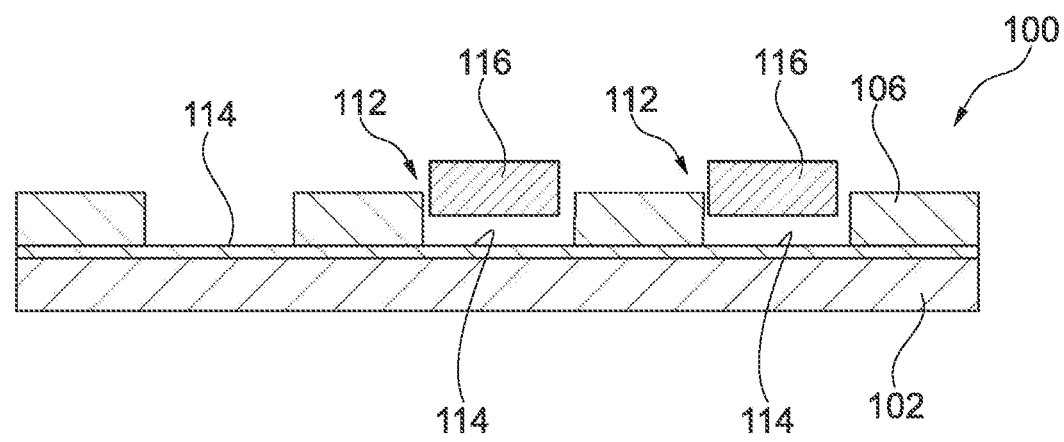
FIG. 8 shows the chip assembly in an alternative manufacturing state according to embodiments of the herein disclosed subject matter.

FIG. 8 shows the chip assembly 100 in an alternative manufacturing state according to embodiments of the herein disclosed subject matter.

According to an embodiment, no die attach liquid is used, i.e. in the associated cavity 112 the electronic chips 116 are placed directly on the attachment material 104, without an intermediate material in-between. Apart from this feature, FIG. 8 corresponds to FIG. 4.

Figure 9:
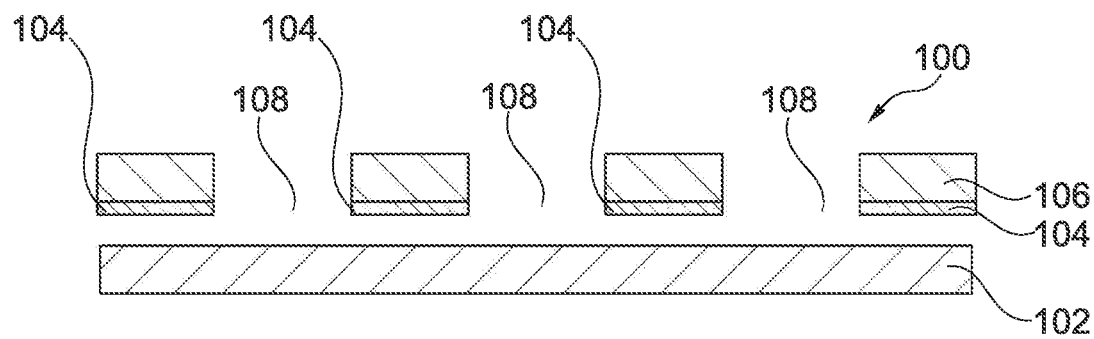
FIG. 9 to FIG. 11 illustrate cross-sectional views of structures obtained during manufacturing of a chip assembly which are alternative to the manufacturing illustrated in FIG. 2 to FIG. 4.
Figure 10:
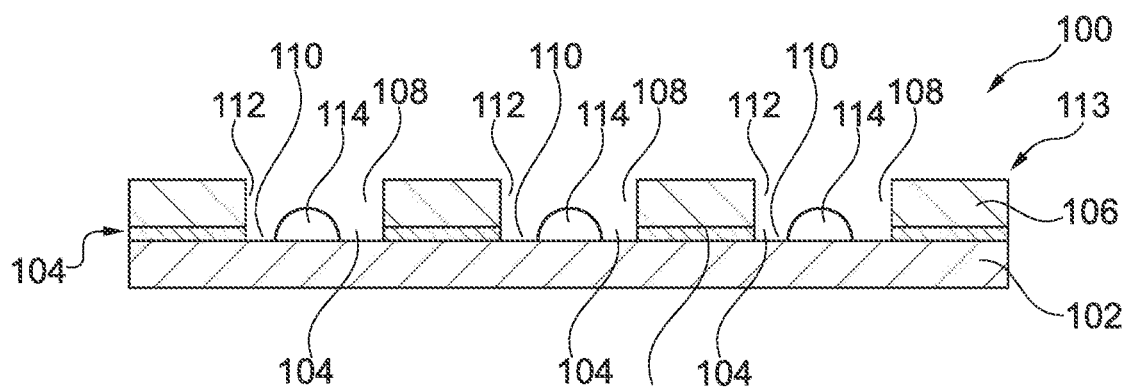
Figure 11:
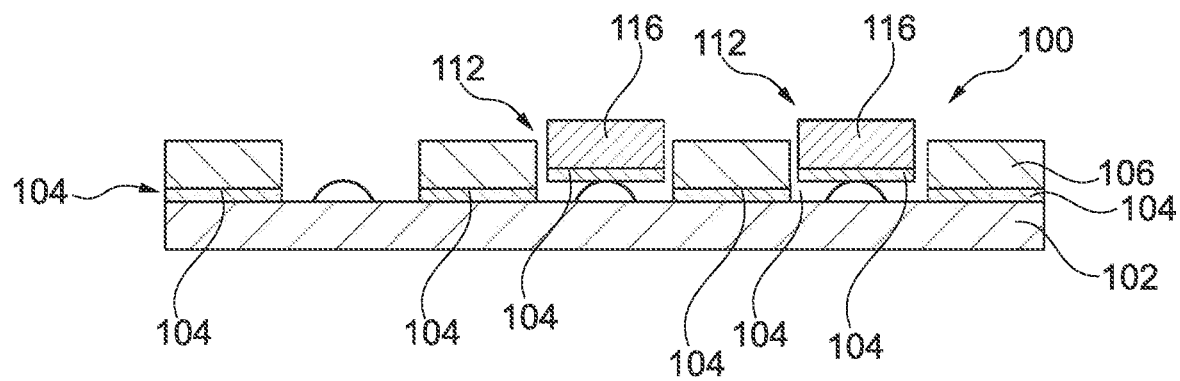

FIG. 9 to FIG. 11 illustrate cross-sectional views of structures obtained during manufacturing of a chip assembly which are alternative to the manufacturing illustrated in FIG. 2 to FIG. 4.

In particular, the method of manufacturing illustrated by FIG. 9 to FIG. 11 differ from FIG. 2 to FIG. 4 in particular in that the layer of an attachment material 104 is provided on the metal grid array 106. Further, in accordance with an embodiment, the attachment material 104 is provided on the electronic chips 116 to allow attachment of the electronic chips on the carrier 102 in the cavities 112.

The structure illustrated in FIG. 11 may be further processed as illustrated by and described with regard to FIGS. 5 and 6.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Moreover, the scope of the present application is not intended to be limited to the particular embodiments of the process, machine, manufacture, composition of matter, means, methods and steps described in the specification. Accordingly, the appended claims are intended to include within their scope such processes, processes, machines, manufacture, compositions of matter, means, methods, or steps.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a chip assembly, the method comprising:
providing a carrier;
providing a continuous layer of an attachment material on the carrier, the attachment material being a solder material or a sinter material;
providing a metal grid array comprising an opening;
attaching the metal grid array to the carrier by the attachment material such that the metal grid array and the carrier define a cavity which is formed by the opening and the carrier; and
mounting an electronic chip in the cavity by the attachment material such that the continuous layer of attachment material extends below the metal grid array and the electronic chip.

2. The method of claim 1, wherein the attachment material comprises silver, copper, tin, antimony and/or indium and/or alloys thereof as the sinter material, or at least one of a lead-tin solder, nickel-gold solder, tin-silver solder, tin-indium-solder, tin-silver-copper-solder, palladium-gold solder, nickel-palladium-gold-silver solder as the solder material.

3. The method of claim 1, wherein the metal grid array is a stamped metal foil, and wherein the opening is formed by stamping.

4. The method of claim 1, wherein the carrier is a leadframe or a direct copper bonding substrate.

5. The method of claim 1, wherein the metal grid array comprises copper with a coating layer of nickel or nickel phosphor.

6. The method of claim 1, wherein mounting the electronic chip comprises:
providing a die attachment liquid or a die attachment film in the cavity; and
placing the electronic chip in the die attachment liquid or onto the die attachment film.

7. The method of claim 1, wherein mounting the electronic chip comprises pressing the electronic chip and the carrier towards each other at a temperature in a range between 200° C. and 400° C.

8. The method of claim 1, wherein mounting the electronic chip comprises pressing both, the electronic chip and the metal grid array, and the carrier towards each other at a temperature in a range between 200° C. and 400° C.

9. The method of claim 1, wherein the electronic chip comprises a mounting surface facing in a direction towards the carrier.

10. The method of claim 1, further comprising aligning the carrier and the metal grid array with respect to each other.

11. The method of claim 1, further comprising arranging a laminate over the electronic chip.

12. The method of claim 1, wherein the metal grid array comprises a plurality of openings, wherein the metal grid array and the carrier define a plurality of cavities, and wherein the method further comprises:
singulating the plurality of cavities after mounting a separate electronic chip in each cavity of the plurality of cavities.

13. A method of manufacturing a chip assembly, the method comprising:
providing a carrier;
providing a metal grid array comprising an opening;
attaching the metal grid array to the carrier by an attachment material which is a solder material or a sinter material, the metal grid array and the carrier defining a cavity which is formed by the opening and the carrier; and
mounting an electronic chip in the cavity.

14. The method of claim 13, wherein the metal grid array comprises a layer of the attachment material, and wherein providing the metal grid array comprises providing the metal grid array with the layer of attachment material thereon.

15. The method of claim 13, wherein the electronic chip has a further attachment material on the electronic chip, and wherein mounting the electronic chip in the cavity comprises mounting the electronic chip with further attachment material in the cavity.

16. The method of claim 13, wherein the metal grid array comprises a plurality of openings, wherein the metal grid array and the carrier define a plurality of cavities, and wherein the method further comprises:
singulating the plurality of cavities after mounting a separate electronic chip in each cavity of the plurality of cavities.

17. The method of claim 1, wherein the cavity is defined by side surfaces of the metal grid array that face the opening and an upper surface of the continuous layer of the attachment material, and wherein the upper surface of the continuous layer of the attachment material extends continuously and directly between the side surfaces of the metal grid array.

18. The method of claim 13, wherein the cavity is defined by side surfaces of the metal grid array that face the opening and an upper surface of the attachment material, and wherein the upper surface of the attachment material extends continuously and directly between the side surfaces of the metal grid array.

\* \* \* \* \*